US012065735B2

(12) United States Patent
Jang et al.

(10) Patent No.: US 12,065,735 B2
(45) Date of Patent: Aug. 20, 2024

(54) VAPOR DEPOSITION APPARATUS

(71) Applicant: SAMSUNG DISPLAY CO., LTD., Yongin-si (KR)

(72) Inventors: Choel-Min Jang, Gyeonggi-do (KR); Jin-Kwang Kim, Gyeonggi-do (KR); Sung-Chul Kim, Gyeonggi-do (KR); Jae-Hyun Kim, Gyeonggi-do (KR); Seung-Yong Song, Gyeonggi-do (KR); Suk-Won Jung, Gyeonggi-do (KR); Myung-Soo Huh, Gyeonggi-do (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 300 days.

(21) Appl. No.: 16/774,409

(22) Filed: Jan. 28, 2020

(65) Prior Publication Data

US 2020/0173015 A1 Jun. 4, 2020

Related U.S. Application Data

(63) Continuation-in-part of application No. 14/302,646, filed on Jun. 12, 2014, now abandoned.

(30) Foreign Application Priority Data

Jul. 25, 2013 (KR) .................. 10-2013-0088263

(51) Int. Cl.
*C23C 16/44* (2006.01)
*C23C 16/455* (2006.01)
*H01J 37/32* (2006.01)

(52) U.S. Cl.
CPC ...... *C23C 16/4412* (2013.01); *C23C 16/4402* (2013.01); *C23C 16/45536* (2013.01); *H01J 37/32357* (2013.01); *H01J 37/32834* (2013.01)

(58) Field of Classification Search
CPC .............. C23C 16/403; C23C 16/4402; C23C 16/4408; C23C 16/4412; C23C 16/455;
(Continued)

(56) References Cited

U.S. PATENT DOCUMENTS 4,550,681 A * 11/1985 Zimmer ................ B05C 5/0254
101/120
4,559,275 A * 12/1985 Matt ...................... F01D 9/023
428/596

(Continued)

FOREIGN PATENT DOCUMENTS

DE 102005035247 A1 * 2/2007 .......... C23C 16/455
DE 102005035247 A1 2/2007
(Continued)

OTHER PUBLICATIONS

Korean Office Action for Application No. 10-2013-0088263 dated Sep. 16, 2019.
(Continued)

*Primary Examiner* — Benjamin Kendall
(74) *Attorney, Agent, or Firm* — CANTOR COLBURN LLP

(57) ABSTRACT

Provided is a vapor deposition apparatus including a first injection unit injecting a first raw gas in a first direction and a first filter unit mounted on the first injection unit. The first filter unit includes a plurality of plates separated from one another in the first direction and disposed in parallel to one another, each of the plurality of plates having holes therein, being detachably coupled with the first filter unit, and having the holes with sizes of horizontal cross-sections gradually increasing in a direction in which the first raw gas moves. Accordingly, a process efficiency of the vapor deposition apparatus may be enhanced.

17 Claims, 5 Drawing Sheets

(58) Field of Classification Search
CPC ........ C23C 16/45517; C23C 16/45536; C23C 16/45538; C23C 16/45551; C23C 16/45563; C23C 16/45565; C23C 16/45578; C23C 16/45591; C23C 16/50; C23C 16/509; C23C 16/5093; C23C 16/54; H01J 37/32091; H01J 37/32357; H01J 37/3244; H01J 37/32449; H01J 37/32541; H01J 37/32633; H01J 37/32779; H01J 37/32834; H01L 21/67017; H01L 51/56; H05H 2001/2431; H05H 2001/245; H05H 2001/4675; Y10T 137/794

See application file for complete search history.

(56) References Cited

U.S. PATENT DOCUMENTS

| | | | |
|---|---|---|---|
| 5,423,936 A * | 6/1995 | Tomita | H01J 37/3244 156/345.34 |
| 6,178,660 B1 | 1/2001 | Emmi et al. | |
| 7,109,660 B2 | 9/2006 | Ishihara et al. | |
| 8,486,737 B2 | 7/2013 | Lee et al. | |
| 2002/0136909 A1 * | 9/2002 | Yang | C23C 16/45563 428/447 |
| 2003/0037729 A1 * | 2/2003 | DeDontney | C23C 16/45519 156/345.33 |
| 2003/0049372 A1 * | 3/2003 | Cook | H01L 21/67757 118/724 |
| 2005/0167052 A1 * | 8/2005 | Ishihara | H01J 37/32834 156/345.47 |
| 2005/0224179 A1 * | 10/2005 | Moon | H01J 37/32834 156/345.29 |
| 2009/0165715 A1 * | 7/2009 | Oh | C23C 16/45551 118/723 R |
| 2013/0092085 A1 | 4/2013 | Lee | |
| 2014/0051253 A1 | 2/2014 | Guha | |
| 2014/0158786 A1 * | 6/2014 | Santo | C23C 16/45565 239/1 |
| 2014/0299681 A1 | 10/2014 | Kashyap et al. | |

FOREIGN PATENT DOCUMENTS

| | | |
|---|---|---|
| KR | 1020010077002 A | 8/2001 |
| KR | 1020070009186 A | 1/2007 |
| KR | 1020080044775 A | 5/2008 |
| KR | 1020100006479 A | 1/2010 |
| KR | 1020130041742 A | 4/2013 |
| KR | 1020130071586 A | 7/2013 |

OTHER PUBLICATIONS

Korean Office Action for Application No. 10-2020-0063240 dated Jul. 7, 2020.

\* cited by examiner

VAPOR DEPOSITION APPARATUS

RELATED APPLICATIONS

This application is a continuation in part of U.S. Application Ser. No. 14/302,646, filed on Jun. 12, 2014, which claims priority to Korean Patent Application No. 10-2013-0088263, filed on Jul. 25, 2013, in the Korean Intellectual Property Office, the disclosure of which is incorporated herein in its entirety by reference.

BACKGROUND

1. Field

One or more embodiments of the present disclosure relate to a vapor deposition apparatus.

2. Description of the Related Art

Semiconductor devices, display apparatuses, and other electronic devices include a plurality of thin films. There are various methods of forming such thin films. One of them is a vapor deposition method.

The vapor deposition method uses one or more gases as a raw material for forming thin films. Such a vapor deposition method includes chemical vapor deposition (CVD), atomic layer deposition (ALD), and various other methods.

Among them, in ALD, one raw material is injected onto a substrate and then purged and pumped to absorb a single molecular layer or more layers, and then another raw material is injected onto the substrate and then purged and pumped to finally form a desired single atomic layer or a plurality of atomic layers.

Among display apparatuses, organic light-emitting display apparatuses have not only wide viewing angles and excellent contrasts but also rapid response times, and thus, are attracting attention as next generation display apparatuses.

The organic light-emitting display apparatuses respectively include an intermediate layer including an organic emission layer between a first electrode and a second electrode facing each other and one or more various thin films in addition thereto. In this case, to form thin films of the organic light-emitting display apparatuses, deposition processes may be used.

However, as the organic light-emitting display apparatuses have become larger and high resolution is necessary, it is difficult to deposit large-sized thin films with desired properties. Also, there is a limitation to improve the efficiency of processes of forming such thin films.

SUMMARY

One or more embodiments of the present disclosure include a vapor deposition apparatus that is capable of improving deposition layer properties and is easily maintained and repaired.

Additional aspects will be set forth in part in the description which follows and, in part, will be apparent from the description, or may be learned by practice of the presented embodiments.

According to one or more embodiments of the present disclosure, a vapor deposition apparatus includes a first injection unit injecting a first raw gas in a first direction and a first filter unit mounted on the first injection unit, the first filter unit including a plurality of plates separated from one another in the first direction and disposed in parallel to one another, each of the plurality of plates having holes formed therein, being detachably coupled with the first filter unit, and having the holes with sizes of horizontal cross-sections gradually increasing in a direction in which the first raw gas moves.

A numbers of the holes formed in the plurality of plates may increase in the first direction.

A size of the holes formed in the plurality of plates may decrease in the first direction.

The vapor deposition apparatus may further include a second injection unit injecting a second raw gas in the first direction. In this case, the second injection unit may include a plasma generation part including a plasma generator, a corresponding surface surrounding the plasma generator, and a plasma generation space formed between the plasma generator and the corresponding surface.

The vapor deposition apparatus may further include an exhaust unit located between the first injection unit and the second injection unit. A second filter unit may be mounted on the exhaust unit, and the second filter unit may have a structure in which the first filter unit is upside down.

The vapor deposition apparatus may further include a supply part supplying the second raw gas to the plasma generation space. A third filter unit may be mounted on the supply part.

The first filter unit and the third filter unit may have the same configuration.

The vapor deposition apparatus may further include a purge unit between the first injection unit and the second injection unit.

According to one or more embodiments of the present disclosure, a vapor deposition apparatus for forming a deposition film on a substrate includes a first injection unit injecting a first raw gas in a first direction, the first direction being a substrate direction, a purge unit injecting a purge gas in the first direction, and an exhaust unit discharging an exhaust gas in a second direction opposite the first direction. In this case, a first filter unit is mounted on an end portion of the first injection unit, a second filter unit is mounted on an end portion of the exhaust unit, and the second filter unit has a structure in which the first filter unit is upside down.

The first filter unit may include a plurality of plates disposed in the first direction in parallel to one another. Holes may be formed in each of the plurality of plates.

The plurality of plates may be arranged to be separated from one another, and a number of the holes formed in the plurality of plates may increased in the first direction.

The number of the holes formed in the plurality of plates may increase two or three times in the first direction.

A size of the holes formed in the plurality of plates may decrease in the first direction.

Each of the plurality of plates may be detachably coupled with the first filter unit.

The vapor deposition apparatus may include a second injection unit injecting a second raw gas into the second direction, wherein the purge unit and the exhaust unit may be disposed between the first injection unit and the second injection unit.

The second injection unit may further include a plasma generation part including a plasma generator, a corresponding surface surrounding the plasma generator, and a plasma generation space formed between the plasma generator and the corresponding surface.

The vapor deposition apparatus may further include a supply part supplying the second raw gas to the plasma generation space. A third filter unit may be mounted on the supply part.

The first filter unit and the third filter unit may have the same configuration.

The substrate and the vapor deposition apparatus may be formed to move relative to each other.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
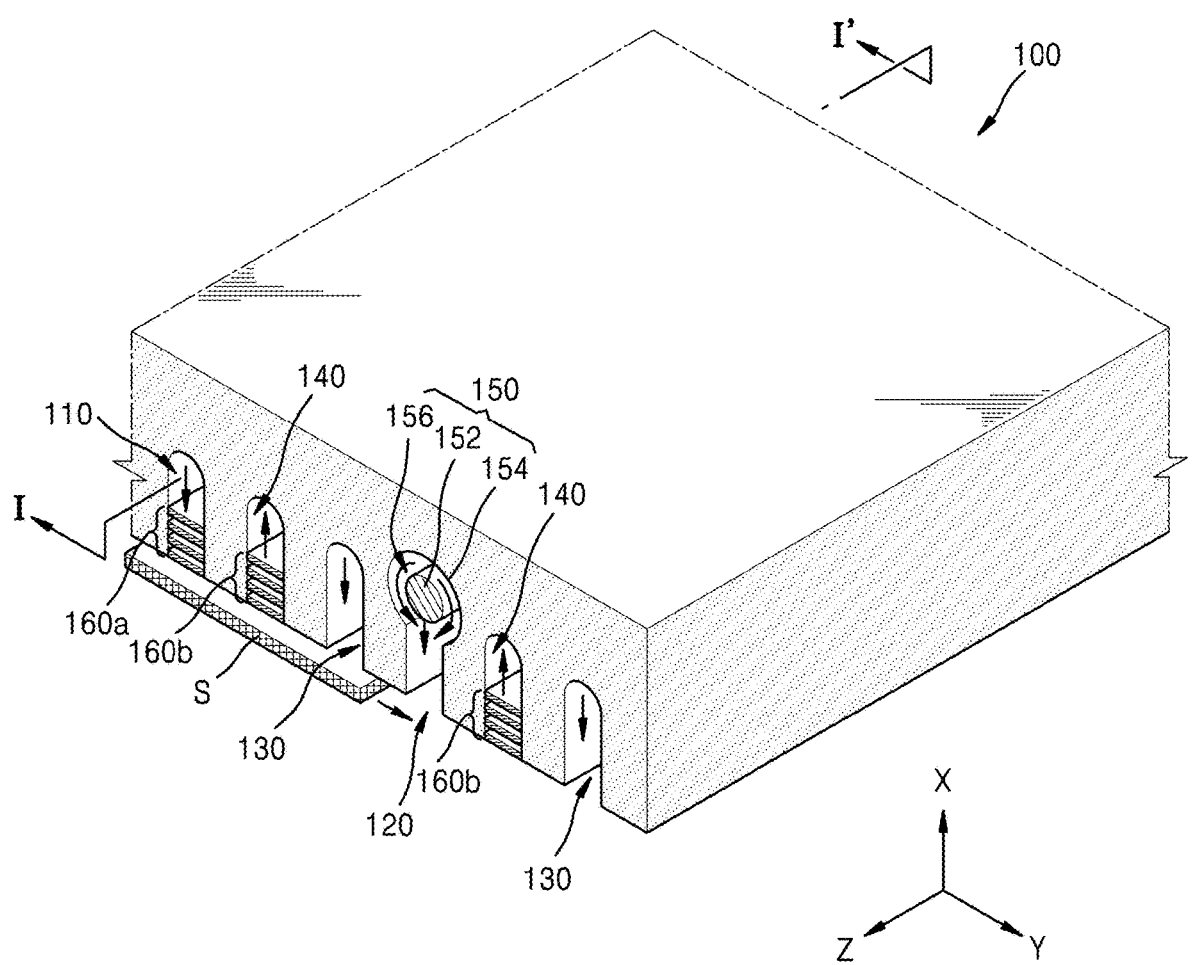
FIG. 1 is a schematic cross-sectional view illustrating a vapor deposition apparatus according to an embodiment of the present disclosure.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Since the present disclosure may have various modifications and several embodiments, exemplary embodiments are shown in the drawings and will be described in detail. However, this is not to limit the present disclosure to the exemplary embodiments but should be understood as including all modifications, equivalents, and substitutes included in the spirit and the scope of the present disclosure. While describing the present disclosure, when it is determined that a detailed description of well-known typical art may make the points of the present disclosure unclear, the detailed description will be omitted.

It will be understood that although the terms "first", "second", etc. may be used herein to describe various components, these components should not be limited by these terms. These terms are only used to distinguish one component from another.

It will be understood that when a layer, film, region, or plate is referred to as being "formed on," another layer, film, region, or plate, it can be directly or indirectly formed on the other layer, film, region, or plate. That is, for example, intervening layers, films, regions, or plates may be present.

Hereinafter, embodiments of the present disclosure will be described in detail with reference to the attached drawings, in which like reference numerals designate like elements and repetitive explanation thereof will be omitted. In the drawings, thicknesses of several layers and regions are enlarged to clearly illustrate them. Also, for convenience of description, thicknesses of some layers and regions are exaggerated.

Figure 2:
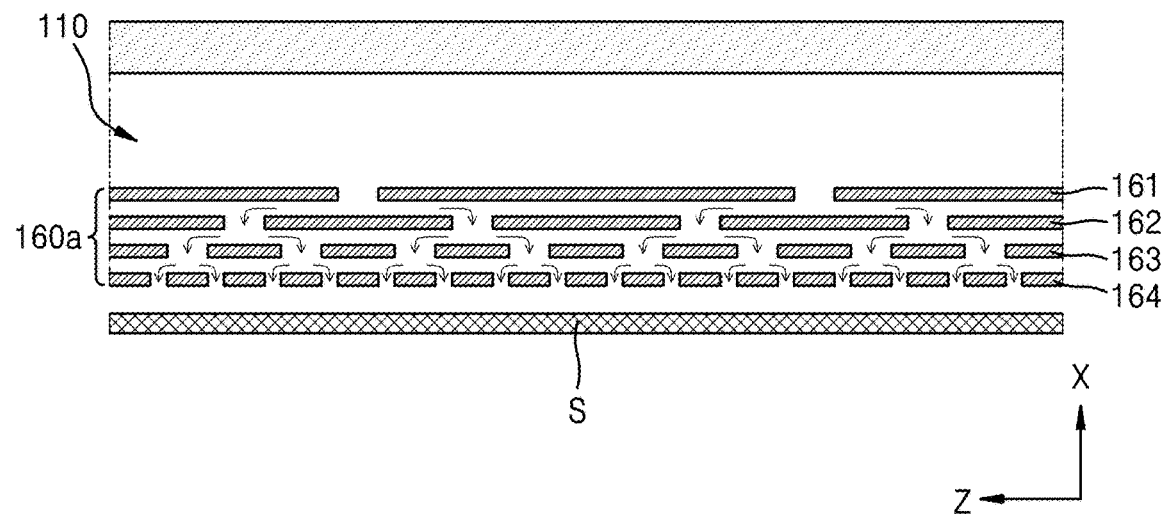
FIG. 2 is a cross-sectional view illustrating a part I-I' shown in FIG. 1.
Figure 3:
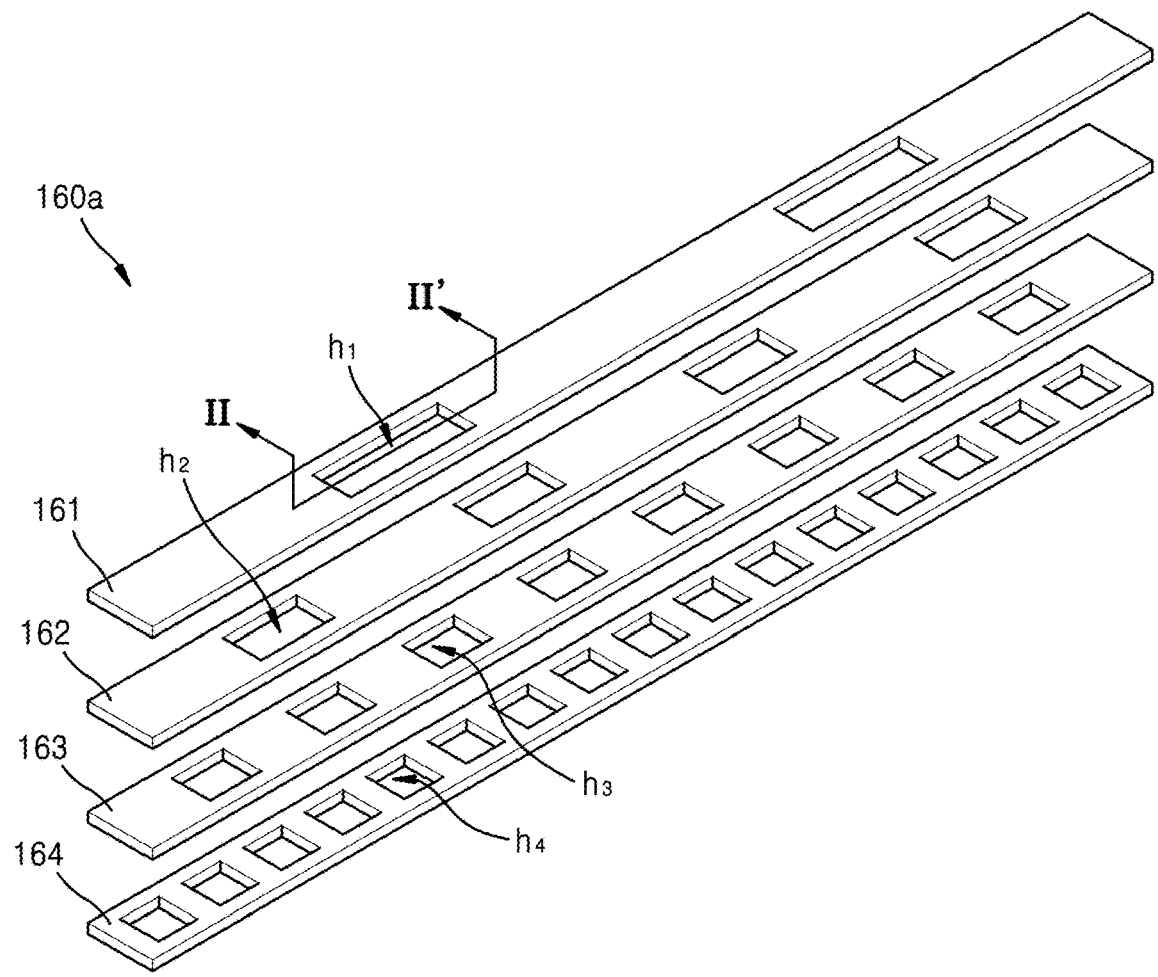
FIG. 3 is a perspective view illustrating a first filter unit of FIG. 1.
Figure 4:
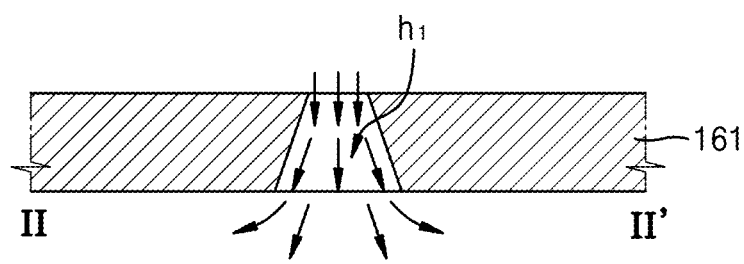
FIG. 4 is a cross-sectional view illustrating an example of a part II-II' shown in FIG. 3.
Figure 5:
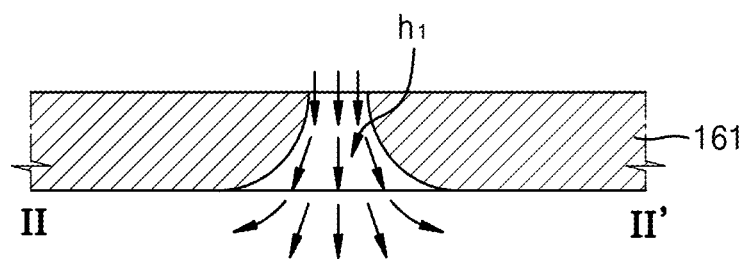
FIG. 5 is a cross-sectional view illustrating another example of the part II-II' shown in FIG. 3.

FIG. 1 is a schematic cross-sectional view illustrating a vapor deposition apparatus 100 according to an embodiment of the present disclosure, FIG. 2 is a cross-sectional view illustrating a part I-I' of FIG. 1, and FIG. 3 is a perspective view illustrating a first filter unit 160a of FIG. 1. FIGS. 4 and 5 are cross-sectional views respectively illustrating an example of a part II-II' of FIG. 3.

Referring to FIGS. 1 to 3, the vapor deposition apparatus 100 may include a first injection unit 110 injecting a first raw gas in a first direction, the first direction being a substrate direction, and a second injection unit 120 injecting a second raw gas in the first direction. The first injection unit 110 and the second injection unit 120 may be separated from each other. Also, the vapor deposition apparatus 100 may further include a purge unit 130 and an exhaust unit 140 located between the first injection unit 110 and the second injection unit 120.

The first filter unit 160a may be mounted on the first injection unit 110. The first filter unit 160a may be mounted on an end portion of the first injection unit 110 and may allow the first raw gas injected by the first injection unit 110 to be evenly injected onto the substrate S.

For this, the first filter unit 160a may include a plurality of plates 161 to 164, which may be disposed in parallel to one another in the first direction. Also, the plurality of plates 161 to 164 are arranged to be separated from one another and each of the plurality of plates 161 to 164 may include holes h1 to h4 through which the first raw gas passes. Thereby, the first filter unit 160a may allow the first raw gas to be uniformly injected onto the substrate S by controlling a transfer path of the first raw gas while the first raw gas is transferred in the first direction.

Hereinafter, referring to FIGS. 2 and 3, the first filter unit 160a will be described in detail. As shown in FIGS. 2 and 3, the first filter unit 160a includes the first plate 161, the second plate 162, the third plate 163, and the fourth plate 164 sequentially disposed in the first direction. However, the present disclosure is not limited thereto. That is, the first filter unit 160a may include more or less plates in order to allow the first raw gas to be uniformly injected onto the substrate S.

Referring to FIGS. 2 and 3, the first plate 161 may be located farthest from the substrate S and the fourth plate 164 may be located nearest to the substrate S.

Comparing the first plate 161 with the second plate 162, the number of the second holes h2 formed in the second plate 162 disposed nearer the substrate S than the first plate 161 in the first direction may be larger than the number of the first holes h1 formed in the first plate 161. For example, the number of the second holes h2 may be two or three times as large as the number of the first holes h1.

On the other hand, to allow the first raw gas passing through the first holes h1 to arrive at the second holes h2 with a uniform mean transfer distance, the first holes h1 may be located in center portions between the second holes h2 formed in the periphery thereof, respectively.

For example, as shown in FIGS. 2 and 3, when the number of the second holes h2 is two times as large as the number of the first holes h1, one of the first holes h1 may be located on the middle point of a line connecting two second holes h2. Also, when the number of the second holes h2 is three times as large as the number of the first holes h1, three adjacent second holes h2 form an equilateral triangle and the first hole h1 may be located at the center of the equilateral triangle formed by the second holes h2.

Also, to allow a larger amount of the first raw gas to pass through the holes, a size of the first hole h1 may be larger than that of the second hole h2.

When the first holes h1 and the second holes h2 are formed as described above, the first raw gas may evenly widely spread in the first filter unit 160a.

Similarly, the number of the third holes h3 formed in the third plate 163 disposed nearer to the substrate S than the second plate 162 in the first direction may be larger than the number of the second holes h2 formed in the second plate 162 and the number of the fourth holes h4 formed in the fourth plate 164 may be larger than the number of the third holes h3.

Also, to allow the first raw gas to evenly spread with a uniform mean transfer distance, the respective second holes h2 may be located in center portions between the third holes h3 formed in the periphery thereof and the respective third holes h3 may be located in center portions between the fourth holes h4 formed in the periphery thereof. Also, in the first direction, sizes of holes h2 to h4 may be smaller from the second holes h2 to the fourth holes h4.

Accordingly, when transferred toward the substrate S, the first raw gas is evenly dispersed overall the first filter unit 160a in such a way that the first raw gas may be uniformly injected onto the substrate S, thereby easily improving the properties of a thin film formed on the substrate S.

Also, since the first raw gas may arrive at the fourth holes h4 along the uniform mean transfer distance, there is no pressure difference among the fourth holes h4 through which the first raw gas is finally injected. Accordingly, the present disclosure may be applied to a case where condensation of the first raw gas caused by the hole pressure is of concern.

Also, while the first raw gas is being transferred, impurities such as particles included in the first raw gas may be filtered by the plurality of plates 161 to 164.

On the other hand, as shown in FIGS. 2 and 3, the numbers of the first to fourth holes h1 to h4 formed in the first to fourth plates 161 to 164 respectively double from the first plate 161 to the fourth plate 164, but the present disclosure is not limited thereto. For example, the numbers of the first to fourth holes h1 to h4 formed in the first to fourth plates 161 to 164 may increase by three, four, or N times or may increase irregularly from the first plate 161 to the fourth plate 164.

The plurality of plates 161 to 164 may be formed of a material having excellent corrosion resistance and each of the plurality of plates 161 to 164 may be detachably coupled with the first filter unit 160a. Accordingly, the plurality of plates 161 to 164 may be periodically replaced and it is possible to easily remove particles filtered by the plurality of plates 161 to 164. Accordingly, it may be easy to maintain and repair the vapor deposition apparatus 100.

The holes h1 to h4 in the plurality of plates 161 to 164 may be formed so that sizes of horizontal cross-sections of the holes h1 to h4 gradually increase in a direction in which the first raw gas moves. As an example, FIGS. 4 and 5 respectively illustrate a cross-section of the first hole h1 passing through the first plate 161. As shown in FIG. 4, a longitudinal cross-section of the first hole h1 may have a trapezoidal shape. As another example, as shown in FIG. 5, a longitudinal cross-section of the first hole h1 may include an inclined surface convex toward inside of the first hole 1. Accordingly, when the first raw gas passes through the first plate 161, as a size of the first hole h1 gradually increases, the first raw gas may more effectively spread. FIGS. 4 and 5 respectively illustrate a shape of the first hole h1 as an example. However, the second to fourth holes h2 to h4 may also have a shape identical to a shape of the first hole h1.

Referring to FIG. 1, the second injection unit 120 may include a plasma generation part 150. The plasma generation part 150 may include a plasma generator 152, a corresponding surface 154 surrounding the plasma generator 152, and a plasma generation space 156 formed between the plasma generator 152 and the corresponding surface 154.

The plasma generator 152 may be an electrode having a round bar shape, and the corresponding surface 154 may be a grounded electrode. A voltage is applied to the plasma generator 152. However, the present embodiment is not limited thereto and the plasma generator 152 may be grounded, and a voltage may be applied to the corresponding surface 154. When generating an electric potential difference between the plasma generator 152 and the corresponding surface 154 described above, plasma may be generated in the plasma generation space 156 and the second raw gas may be changed into radicals in the plasma generation space 156.

As shown in FIG. 1, the vapor deposition apparatus 100 includes one first injection unit 110 and one second injection unit 120 however the present disclosure is not limited thereto. That is, the vapor deposition apparatus 100 may include a plurality of first injection units 110 and a plurality of second injection units 120. In this case, the plurality of first injection units 110 and the plurality of second injection units 120 may be alternately disposed.

The purge unit 130 is located next to the first injection unit 110 and the second injection unit 120 based on a transfer direction of the substrate S and injects a purge gas in the first direction. The purge gas may be a gas having no deposition effect, for example, argon or nitrogen gas. When the purge gas is injected onto the substrate S by the purge unit 130, extra gases of the first raw gas and the second raw gas, which is not used for forming a thin film, and by-products formed during a deposition process may be physically separated from the substrate S.

The exhaust unit is located next to the first injection unit 110 and the second injection unit 120 based on the transfer direction of the substrate S and exhausts the by-products and an extra gas separated from the substrate S in a second direction opposite the first direction.

A second filter unit 160b may be mounted on the exhaust unit 140. The second filter unit 160b may have the same configuration as a configuration of the first filter unit 160a. Accordingly, the second filter unit 160b may include the plurality of plates 161 to 164 described with reference to FIGS. 3 to 5. However, since an exhaust gas passes through the second filter unit 160b in the second direction, in the second filter unit 160b, the first plate 161 is located nearest the substrate S. That is, since the second filter unit 160b has a structure in which the first filter unit 160a is upside down, the entire configuration of the vapor deposition apparatus 100 may be simplified.

On the other hand, since the holes h1 to h4 as described above are formed in the plurality of plates 161 to 164 included in the second filter unit 160b, the exhaust gas may also be sucked while traveling along the uniform mean transfer distance. In addition, sizes of horizontal cross-sections of the first to fourth holes h1 to h4 may gradually increase in a direction in which the exhaust raw gas moves. Accordingly, it is possible to perform uniform suction of the exhaust gas.

Particularly, raw gases among the exhaust gas may be deposited on a side wall of the exhaust unit 140. The second filter unit 160b is mounted on an end portion of the exhaust unit 140 in such a way that the plurality of plates 161 to 164 functions as anti-deposition plates, thereby preventing the raw gases from being deposited on the side wall of the exhaust unit 140. Also, since each of the plurality of plates 161 to 164 may be detachably coupled with the second filter unit 160b, it is possible to replace the plurality of plates 161 to 164. Also, since a thin film formed on the plurality of plates 161 to 164 may be easily removed, it may be easy to maintain and repair the vapor deposition apparatus 100.

Hereinafter, referring to FIG. 1, a method of forming a thin film on the substrate S will be briefly described. The following description refers to a case where the thin film is formed of AlxOy while the substrate S is being transferred in one direction.

The substrate S, on which deposition is performed, is disposed to correspond to the first injection unit 110, and then, the first injection unit 110 injects the first raw gas in the first direction. In this case, the first raw gas may be uniformly injected onto the substrate S while passing through the first filter unit 160a.

The first raw gas may be a gas containing Al atoms, for example, gaseous trimethyl aluminum (TMA). Thus, an adsorption layer containing Al is formed on a top surface of the substrate S, wherein the adsorption layer may include a chemical adsorption layer and a physical adsorption layer.

Regarding the adsorption layer formed on the top surface of the substrate S, the physical adsorption layer has a low binding molecular force between molecules, and thus, is separated from the substrate S by the purge gas injected by the purge unit 130 located next to the first injection unit 110 according to the motion of the substrate S. Also, the physical adsorption layer separated from the substrate S may be effectively removed from the substrate S by pumping of the exhaust unit 140 located next to the first injection unit 110 according to the motion of the substrate S. In this case, since the second filter unit 160b is mounted on the exhaust unit 140, the physical adsorption layer may be uniformly removed from the substrate S.

When the substrate S is disposed to correspond to the second injection unit 120, the second raw gas is injected in the first direction through the second injection unit 120. The second raw gas may contain radicals. For example, the second raw gas may include oxygen radicals. The oxygen radicals may be formed by injecting $H_2O$, $O_2$, $N_2O$, etc. into the plasma generation part 150 described below. The second raw gas may react with the chemical adsorption layer formed by the first raw gas previously adsorbed onto the substrate S or may substitute a part of the chemical adsorption layer, thereby finally forming a desired deposition layer, for example, an AlxOy layer. However, an excess of the second raw gas may form the physical adsorption layer and may remain on the substrate S.

The physical adsorption layer of the second raw gas that remains on the substrate S may be separated from the substrate S by the purge gas injected by the purge unit 130 located next to the second injection unit 120 according to the motion the substrate S and may be uniformly removed from the substrate S by pumping of the exhaust unit 140. The second filter unit 160b mounted on the exhaust unit 140. Accordingly, while the substrate S is passing through a bottom area of the vapor deposition apparatus 100, a desired single atomic layer may be formed on the substrate S.

As shown in FIG. 1, the substrate S is transferred in one direction, that is, the substrate S and the vapor deposition apparatus 100 move relative to each other to perform a deposition process. However, the present disclosure is not limited thereto. For example, during the deposition process, the substrate S may reciprocate below the vapor deposition apparatus 100 or the substrate S is fixed and the vapor deposition apparatus 100 is transferred to perform continuously deposition processes.

FIG. 4 is a cross-sectional view illustrating a modified example of the vapor deposition 100 of FIG. 1.

A vapor deposition apparatus 200 shown in FIG. 4 may include a first injection unit 210, a purge unit 230, an exhaust unit 240, and a second injection unit 220.

A first filter unit 260a may be mounted on an end portion of the first injection unit 210, and a second filter unit 260b may be mounted on an end portion of the exhaust unit 240. Also, the second injection unit 220 may include a plasma generation part 250 including a plasma generator 252, a corresponding surface 254 surrounding the plasma generator 252, and a plasma generation space 256 formed between the plasma generator 252 and the corresponding surface 254.

The first injection unit 210, the second injection unit 220, the purge unit 230, the exhaust unit 240, the plasma generation part 250, the first filter unit 260a, and the second filter unit 260b are respectively identical to the first injection unit 110, the second injection unit 120, the purge unit 130, the exhaust unit 140, the plasma generation part 150, the first filter unit 160a, and the second filter unit 160b illustrated in FIGS. 1 and 3.

Referring to FIG. 4, the vapor deposition apparatus 200 may further include a supply part supplying a second raw gas to the plasma generation space 256. A third filter unit 280 may be mounted on the supply part.

The supply part may have a penetration hole to receive the second raw gas from an external tank (not shown) and to transfer the second raw gas to the plasma generation space 256, but the present disclosure is not limited thereto. Also, the number of supply parts may be determined according to a size of the substrate S on which a deposition process will be performed.

The third filter unit 280 may have same configuration as the first filter unit 160a illustrated in FIGS. 2 to 5. That is, the third filter unit 280 may include a plurality of plates disposed to be parallel to one another in a first direction, each of the plurality of plates having holes therein for allowing the second raw gas to pass therethrough. In addition, a size of a horizontal cross-section of each of the holes may gradually increase in a direction in which the second raw gas passes therethrough.

Accordingly, the second raw gas may be uniformly supplied to the plasma generation space 256 in a longitudinal direction of the plasma generation space 256. Also, since it is possible to inject the second raw gas at a low pressure into the plasma generation space 256, the second raw gas may be changed into radical form more effectively, thereby improving the deposition efficiency of the vapor deposition apparatus 200.

Figure 6:
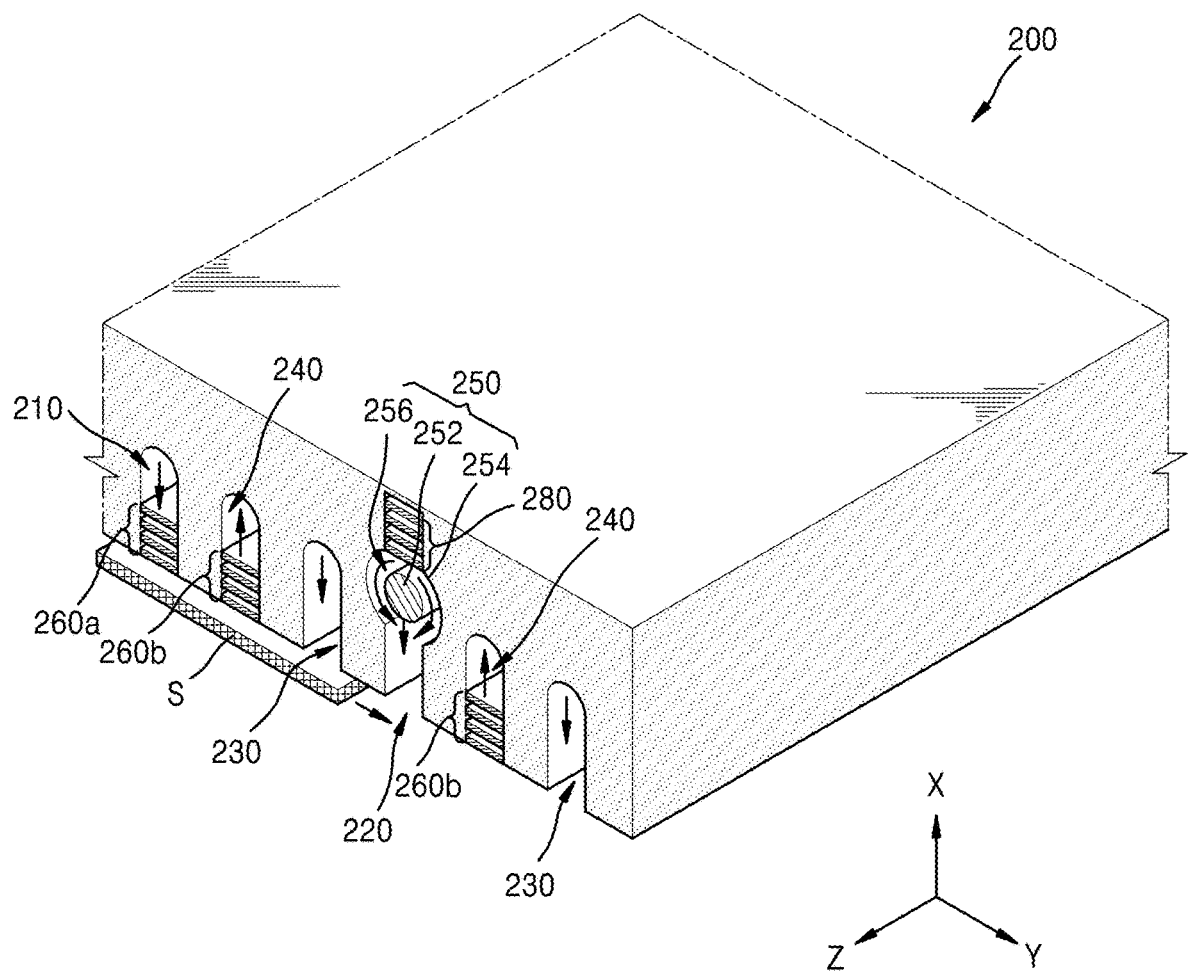
FIG. 6 is a cross-sectional view illustrating a modified example of the vapor deposition of FIG. 1.
Figure 7:
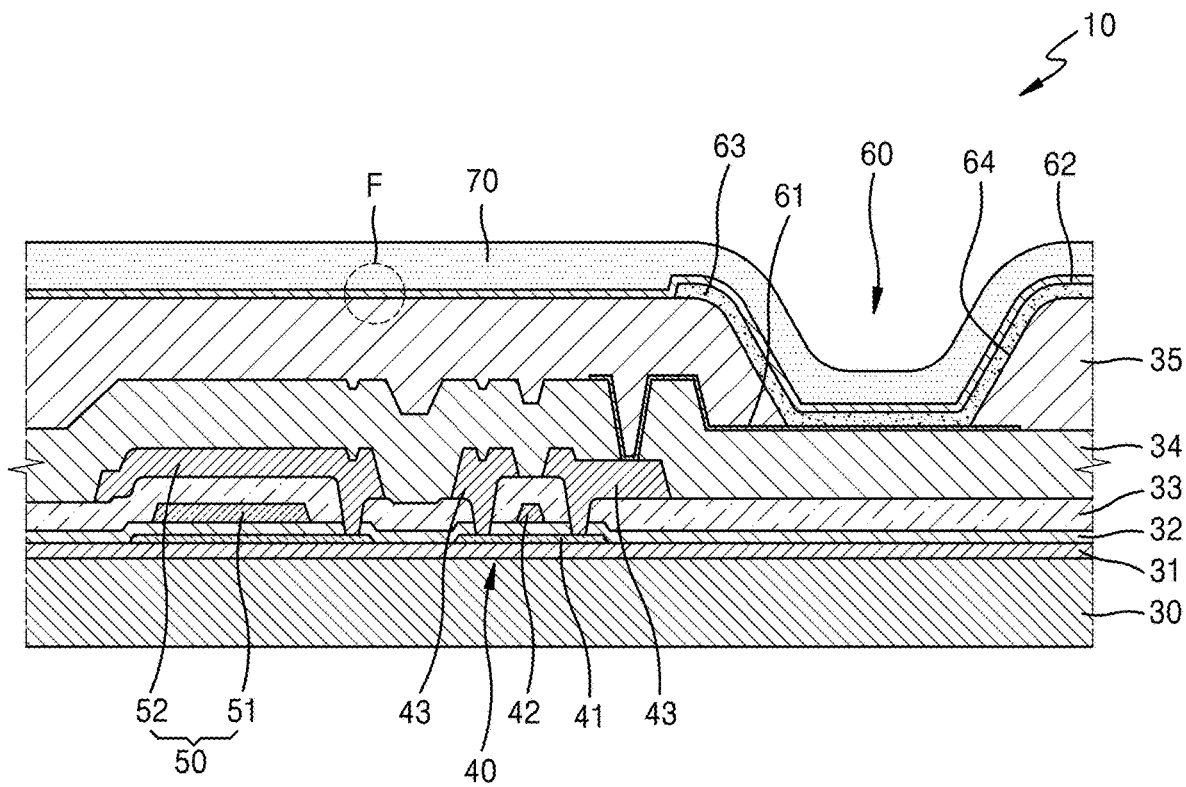
FIG. 7 is a schematic cross-sectional view illustrating an organic light-emitting display apparatus manufactured by using the vapor deposition apparatus of FIG. 1.
Figure 8:
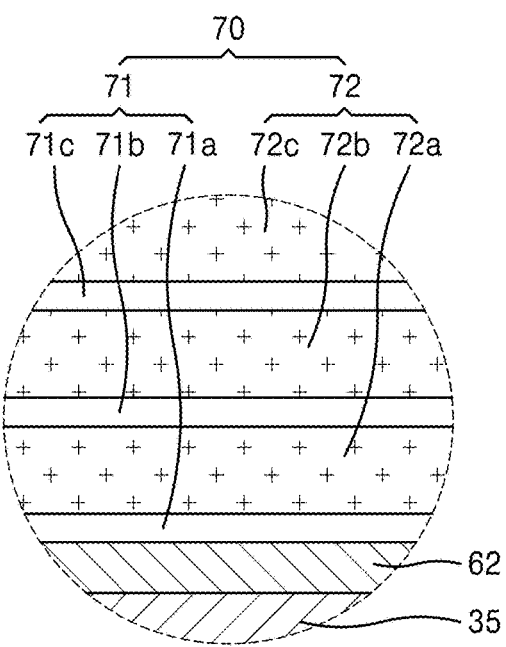
FIG. 8 is an enlarged view illustrating a part F shown in FIG. 7.

FIG. 5 is a schematic cross-sectional view illustrating an organic light-emitting display apparatus 10 manufactured by using the vapor deposition apparatus 100, and FIG. 6 is an enlarged view illustrating a part F shown in FIG. 5.

The organic light emitting display apparatus 10 is formed on a substrate 30. The substrate 30 may be formed of one of a glass material, a plastic material, and a metallic material.

The substrate 30 has a top flat surface, and a buffer layer 31 containing an insulating material to prevent penetration of water and foreign bodies in the substrate 30 is formed in a substrate direction on the substrate 30.

A thin film transistor (TFT) 40, a capacitor 50, and an organic light-emitting device (OLED) 60 are formed on the buffer layer 31. The TFT 40 includes an active layer 41, a gate electrode 42, and source/drain electrodes 43. The OLED 60 includes a first electrode 61, a second electrode 62, and an intermediate layer 63.

The capacitor 50 includes a first capacitor electrode 51 and a second capacitor electrode 52.

In detail, the active layer 41 is formed in a certain pattern on a top surface of the buffer layer 31. The active layer 41 may contain one of an inorganic semiconductor material such as silicon, an organic semiconductor material, and an oxide semiconductor material and may be formed by injecting p-type or n-type dopant. The first capacitor electrode 51 is formed on the same layer and of the same material as the active layer 41.

A gate insulating layer 32 is formed on a top surface of the active layer 41. The gate electrode 42 is formed on a top surface of the gate insulating layer 32 to correspond to the active layer 41. An interlayer dielectric 33 is formed to cover the gate electrode 42 and the source/drain electrodes 43 are formed on the interlayer dielectric 33 to be in contact with a certain area of the active layer 41. The second capacitor electrode 52 is formed on the same layer and of the same material as the source/drain electrodes 43.

A passivation layer 34 is formed to cover the source/drain electrodes 43, and an additional insulating layer may further be formed to planarize the TFT 40.

The first electrode 61 is formed on the passivation layer 34. The first electrode 61 may be formed to be electrically connected to any one of the source/drain electrodes 43. Also, a pixel defining layer 35 is formed to cover the first electrode 61. A certain opening 64 is formed on the pixel defining layer 35, and then the intermediate 63 including an organic emission layer is formed in an area defined as the opening 64. The second electrode 62 is formed on the intermediate layer 63.

An encapsulation layer 70 is formed on the second electrode 62. The encapsulation layer 70 may contain an organic material or an inorganic material and may have a structure formed by alternatively depositing the organic material and inorganic material.

The encapsulation layer 70 may be formed by using the vapor deposition apparatus 100 or 200 described above. That is, a desired layer may be formed by allowing the substrate 30 formed with the second electrode 62 to pass through the vapor deposition apparatus 100 or 200.

Particularly, the encapsulation layer 70 includes an inorganic layer 71 and an organic layer 72. The inorganic layer 71 includes a plurality of layers 71a, 71b, and 71c, and the organic layer 72 includes a plurality of layers 72a, 72b, and 72c. In this case, the plurality of layers 71a, 71b, and 71c of the inorganic layer 71 may be formed by using the vapor deposition apparatus 100 or 200.

However, the present embodiment is not limited thereto. That is, other insulating layers of the organic light emitting display apparatus 10 such as the buffer layer 31, the gate insulating layer 32, the interlayer dielectric 33, the passivation layer 34, and the pixel defining layer 35 may be formed by using the vapor deposition apparatus 100 or 200.

Also, other various thin films such as the active layer 41, the gate electrode 42, the source/drain electrodes 43, the first electrode 61, the intermediate layer 63, and the second electrode 62 may be formed by using the vapor deposition apparatus 100 or 200.

As described above, when the vapor deposition apparatuses 100 or 200 is used, the electric properties and image quality of the organic light emitting display apparatus 10 may be enhanced by improving the properties of deposited films formed on the organic light emitting display apparatus 10.

As described above, according to the one or more of the above embodiments of the present disclosure, a raw gas is uniformly injected onto a substrate and an exhaust gas is uniformly sucked, thereby improving the process efficiency of a vapor deposition apparatus.

Also, since impurities and the like are filtered by a filter unit while injecting the raw gas and sucking the exhaust gas and the filter unit is detachably coupled with the vapor deposition apparatus, the vapor deposition apparatus may be easily maintained and repaired.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the accompanying figures, it will be understood by those of ordinary skill in the art that various changes in the form and details may be made therein without departing from the spirit and scope of the present disclosure as defined by the following claims.

What is claimed is:

1. A vapor deposition apparatus comprising:
   a plurality of first injection units injecting a first raw gas in a first direction, at least one of the plurality of first injection unit defining a first recess which is partially defined in the vapor deposition apparatus;
   an exhaust unit located adjacent to at least one of the plurality of first injection units and discharging an exhaust gas, the exhaust unit defining a second recess which is partially defined in the vapor deposition apparatus;
   a first filter unit mounted on an end portion of a side wall of the first recess of the at least one of the plurality of first injection unit; and
   a second filter unit which is mounted on an end portion of a side wall of the second recess of the exhaust unit and has a structure which is reverse to a structure of the first filter unit in the first direction,
   wherein the first filter unit and the second filter unit each comprises a plurality of plates separated from one another in the first direction and disposed in parallel to one another,
   wherein each of the plurality of plates has holes formed therein,
   wherein, in each of the plurality of plates of the second filter unit, sizes of horizontal cross-sections of the holes gradually increase from a bottom surface of a plate of the plurality of plates to a top surface of the plate of the plurality of plates in a direction in which the exhaust gas moves, and
   wherein a lowest plate of the plurality of plates of the second filter unit is aligned with a lowest plate of the plurality of plates of the first filter unit.

2. The vapor deposition apparatus of claim 1, wherein a number of the holes formed in the plurality of plates increases in the direction in which the exhaust gas moves.

3. The vapor deposition apparatus of claim 1, wherein a size of the holes formed in the plurality of plates decreases in the direction in which the exhaust gas moves.

4. The vapor deposition apparatus of claim 1, further comprising a second injection unit injecting a second raw gas in the first direction,
wherein the second injection unit comprises a plasma generation part comprising a plasma generator, a corresponding surface surrounding the plasma generator, and a plasma generation space formed between the plasma generator and the corresponding surface.

5. The vapor deposition apparatus of claim 1, further comprising a supply part supplying the second raw gas to the plasma generation space,
wherein a third filter unit is mounted on the supply part.

6. The vapor deposition apparatus of claim 5, wherein the first filter unit and the third filter unit have a same configuration.

7. The vapor deposition apparatus of claim 1, further comprising a purge unit between at least one of the plurality of first injection units and the second injection unit.

8. A vapor deposition apparatus for forming a deposition film on a substrate, the vapor deposition apparatus comprising:
a plurality of first injection units injecting a first raw gas in a first direction, at least one of the plurality of first injection unit defining a first recess which is partially defined in the vapor deposition apparatus;
a purge unit injecting a purge gas in the first direction; and
an exhaust unit discharging an exhaust gas in a second direction opposite the first direction, the exhaust unit defining a second recess which is partially defined in the vapor deposition apparatus,
wherein a first filter unit is mounted on an end portion of a side wall of the first recess of at least one of the plurality of first injection units, a second filter unit is mounted on an end portion of a side wall of the second recess of the exhaust unit, and the second filter unit has a structure which is reverse to a structure of the first filter unit in the first direction,
the first filter unit and the second filter unit each comprise a plurality of plates disposed in the first direction in parallel to one another, each of the plurality of plates having holes formed therein
in each of the plurality of plates of the first filter unit, sizes of horizontal cross-sections of the holes gradually increase from a top surface of a plate of the plurality of plates to a bottom surface of the plate of the plurality of plates, and
wherein in each of the plurality of plates of the second filter unit, sizes of horizontal cross-sections of the holes gradually increase from a bottom surface of a plate of the plurality of plates to a top surface of the plate of the plurality of plates, and
wherein a lowest plate of the plurality of plates of the second filter unit is aligned with a lowest plate of the plurality of plates of the first filter unit.

9. The vapor deposition apparatus of claim 8, wherein the plurality of plates of the first filter unit is arranged to be separated from one another, and
wherein a number of the holes formed in the plurality of plates of the first filter unit increases in the first direction.

10. The vapor deposition apparatus of claim 9, wherein the number of the holes formed in the plurality of plates of the first filter unit increases two or three times in the first direction.

11. The vapor deposition apparatus of claim 9, wherein a size of the holes formed in the plurality of plates of the first filter unit decreases in the first direction.

12. The vapor deposition apparatus of claim 8, wherein each of the plurality of plates of the first filter unit is detachably coupled with the first filter unit.

13. The vapor deposition apparatus of claim 8, comprising a second injection unit injecting a second raw gas in the first direction,
wherein the purge unit and the exhaust unit are disposed between at least one of the plurality of first injection units and the second injection unit.

14. The vapor deposition apparatus of claim 13, wherein the second injection unit comprises a plasma generation part comprising a plasma generator, a corresponding surface surrounding the plasma generator, and a plasma generation space formed between the plasma generator and the corresponding surface.

15. The vapor deposition apparatus of claim 14, further comprising a supply part supplying the second raw gas to the plasma generation space,
wherein a third filter unit is mounted on the supply part.

16. The vapor deposition apparatus of claim 15, wherein the first filter unit and the third filter unit have a same configuration.

17. The vapor deposition apparatus of claim 8, wherein the substrate moves relative to the vapor deposition apparatus.

* * * * *